United States Patent [19]

Gracia et al.

[11] 3,961,955

[45] *June 8, 1976

[54] PRINTING PROCESS CAPABLE OF REPRODUCING CONTINUOUS TONE IMAGES

[75] Inventors: Robert F. Gracia, Scituate; Richard A. Laughrey, Marblehead; Paul F. Tuohey, Acton, all of Mass.

[73] Assignee: Itek Corporation, Lexington, Mass.

[ * ] Notice: The portion of the term of this patent subsequent to Nov. 27, 1990, has been disclaimed.

[22] Filed: July 23, 1973

[21] Appl. No.: 381,836

Related U.S. Application Data

[63] Continuation-in-part of Ser. Nos. 54,626, July 13, 1970, Pat. No. 3,809,562, and Ser. No. 54,627, July 13, 1970, Pat. No. 3,807,304, and Ser. No. 55,238, July 13, 1970, Pat. No. 3,807,305, and Ser. No. 174,102, Aug. 23, 1971, which is a continuation-in-part of Ser. No. 54,626, July 13, 1970, Pat. No. 3,809,562, and Ser. No. 54,627, July 13, 1970, Pat. No. 3,807,304, and Ser. No. 55,238, July 13, 1970, Pat. No. 3,807,305, and Ser. No. 862,912, Oct. 1, 1969, abandoned, said Ser. No. 54,626, and Ser. No. 54,627, and Ser. No. 55,238, each is a continuation-in-part of Ser. No. 74,467, July 15, 1969, abandoned.

[52] U.S. Cl. .................................. 96/33; 101/450; 101/458; 101/459; 101/466
[51] Int. Cl.² ..................... G03F 7/02; B41M 1/00; B41M 5/00
[58] Field of Search ............ 96/33, 48 PD; 101/450, 101/458, 459, 466

[56] References Cited
UNITED STATES PATENTS

| | | | |
|---|---|---|---|
| 3,231,377 | 1/1966 | Dickinson et al. | 96/33 |
| 3,775,114 | 11/1973 | Gracia et al. | 96/33 |
| 3,807,304 | 4/1974 | Gracia et al. | 96/33 |
| 3,807,305 | 4/1974 | Gracia et al. | 96/33 |
| 3,809,562 | 5/1974 | Gracia et al. | 96/33 |

*Primary Examiner*—David Klein
*Assistant Examiner*—Alfonso T. Suro Pico
*Attorney, Agent, or Firm*—Homer O. Blair; Robert L. Nathans; David E. Brook

[57] ABSTRACT

Continuous tone images are reproduced on a plate having metallic images adherently and preferably conductively bonded to a physically roughened support by contacting with a photographic physical developer an imaging medium comprising a physically developable image of the continuous tone image. The process has the capability of producing an imaged plate containing metal images of varying contrast and varying tonal range and then using the imaged plate as a printing plate. A preferred copy medium comprises a thin silver halide layer coated on a grained and anodized aluminum support.

10 Claims, No Drawings

PRINTING PROCESS CAPABLE OF REPRODUCING CONTINUOUS TONE IMAGES

This application is a continuation-in-part application of U.S. Ser. No. 54,626, filed July 13, 1970, now U.S. Pat. No. 3,809,562; U.S. Ser. No. 54,627, filed July 13, 1970, now U.S. Pat. No. 3,807,304; U.S. Ser. No. 55,238, filed July 13, 1970, now U.S. Pat. No. 3,807,305; and U.S. Ser. No. 174,102, filed Aug. 23, 1971, each of which is incorporated herein by reference. U.S. Ser. No. 174,102 is a continuation-in-part application of the previously mentioned applications U.S. Ser. Nos. 54,626, 54,627, and 55,238 and also U.S. Ser. No. 862,912, filed Oct. 1, 1969, now abandoned; and U.S. Ser. No. 45,927, filed June 12, 1970, now U.S. Pat. No. 3,775,114. Each of the aforementioned U.S. Ser. Nos. 54,626, 54,627, and 55,238 is a continuation-in-part of U.S. Ser. No. 744,631, filed July 15, 1969, now abandoned.

BACKGROUND OF THE INVENTION

1. Field of the Invention

This invention relates to metal imaged plates produced by physical development and to processes of making such plates and using them for printing.

2. Description of the Prior Art

A number of printing plates have been developed in the prior art which have the capability of reproducing a continuous tone image. The first printing plate to be used in this type of printing was the collotype plate. This printing process relied on a hydrophilic colloid which became differentially hardened in the exposed areas of the plate. These areas became ink receptive in proportion to the degree of hardening. One of the main drawbacks of this printing plate was the short run length and the lack of repeatability.

More recently printing plates which have been utilized for reproducing continuous tone images are photopolymers and diazonium salts. These printing plates also suffer from a lack of repeatability particularly for longer run lengths. Another serious disadvantage of these prior art printing plates is that they are generally high contrast systems having the capability of recording and printing only a very short tonal range. Therefore, considerable information is lost from most continuous tone images which are lower contrast and contain an extended tonal range.

Because of these difficulties with most continuous tone printing plates, conventional printing is performed by first screening the print to convert the continuous tone image into a pattern of dots called a halftone image. This halftone image is then used to expose the printing plate. The halftone process which is necessary in most commercial printing, however, does degrade the image and introduces problems in the reproduction process. For example, the halftone image may be unable to resolve the fine details in the picture because the dot structure is larger than the fine detail.

Additional advantages of printing plates which can reproduce continuous tone prints directly (screenless printing) over conventional halftone printing are (1) eliminates moire-effects caused by interference between (a) superimposed halftone patterns and (b) subject and halftone patterns are eliminated, (2) there is a greater ability to produce a higher saturation of pastel colors, and (3) the step of making the halftone is eliminated. Thus halftone printing has been looked upon as a necessary evil by printers because of the additional step required in the printing process, the degradation of the quality of the reproduction, and also the extra time and specialized equipment and materials required.

SUMMARY OF THE INVENTION

The printing plate and process of this invention overcome prior art problems in reproducing continuous tone images. This invention relates to screenless methods of producing printing plates having metal images adherently, intimately, and preferably conductively bonded to a physically roughened support, preferably a grained metal support. Silver halide is a preferred photosensitive material, among other reasons because of the ease of adapting it to produce images of varying contrasts and tonal ranges.

This plate is produced by contacting an imaging medium comprising a physically developable image of a continuous tone image with a physical developer to produce a coherent metal image adherently and intimately bonded to said medium. Preferably, the physically developable image is produced by exposing the selected photosensitive medium to a continuous tone image pattern. A continuous tone image pattern refers to an image pattern having a relatively low contrast and an extended tonal range such that conventional halftone lithography would be necessary when using the conventional high gamma diazo printing process.

Once the adherent metal image is formed, the developed medium can then be treated to improve the printing characteristics of the plate. As part of such treatment, it is generally desirable to increase the oleophilic-hydrophilic differentiation between the image areas and the non-image areas of the plate. This may be done, for example, to a silver image which is deposited on an aluminum support by contacting with materials such as mercaptans which will adhere to the silver image areas making them more oleophilic, alone, or in combination with phosphoric acid which adheres to the non-image areas thereby making the non-image areas more hydrophilic. Additionally, a lithographic preparation containing a polymer such as gum arabic or carboxymethyl cellulose can be applied to improve the hydrophilic character of the non-image parts of the plate. Further, the printing life of the plate as well as the oleophilic character may be improved by coating the plate with lacquers which will adhere selectively to the image areas and not to the non-image areas. Other useful compounds for increasing the printing properties of this metal plate are disclosed in French Patent of Addition No. 77,556, herein incorporated by reference. A silver image may be made more oleophilic by amplifying in a metal ion bath which will produce a metal image more oleophilic than a silver image, e.g. a copper image.

It is preferable to remove the photosensitive layer as one of the steps of forming the printing plate although this can also be accomplished during other processing steps. Usually, this is effected by treatment with a solvent for the photosensitive layer, most commonly a solvent for the binder of the photosensitive layer. Further, the metal image of the printing plate can be amplified using amplifying systems comprising a reducible metal ion such as silver, copper or tin, together with a reducing agent therefor. This amplification is effected before or after removal of the photosensitive layer.

It is believed that the reason that continuous tone images can be reproduced so well by the screenless printing process of this invention is that the physically roughened surface of this invention acts similar to a screen to break up the metal image into a dot pattern and preferably in a very fine random dot pattern which gives the illusion of continuous tone. Also since the photosensitive layer and developer can be manipulated to produce metal images of varying contrasts and tonal ranges, the process of this invention has wide latitude for producing high quality printed likenesses of continuous tone images. Furthermore, since the metal image of the printing plate of this invention is produced by an additive process even very low density areas and tones can be reproduced. Due to extremely thin photosensitive coatings which are possible by this invention (A preferred calculated dry thickness of a silver chloride-polyvinyl alcohol layer is about 0.02 microns.) these low density images can be made to adhere to the roughened plate surface. The run lengths possible in these low density areas are not as great as in the high density areas. This is also to be contrasted with the prior art substractive processes such as diazo and photopolymer which often lose considerable amounts of the information due to the fact that low exposure of a given area of the plate may result in only a surface hardening of the photosensitive layer resulting in removal of this area when contacted with a solvent for the unexposed, unhardened areas of the photosensitive layer.

Thus the term continuous tone image as used herein refers not only to the image formed by exposure of a photosensitive layer such as silver halide to a continuous tone exposure but also to the imaged formed by screenless photography and screenless printing of a continuous tone original image which final image in its preferred form contains varying tones and shadings and an extended tonal range and contains a fine "random dot" or "grainy" structure.

PREFERRED EMBODIMENTS

The photosensitive material of the present media can be any of those which permit physical development of a metal image, i.e., physically developable photosensitive materials. This type of photosensitive material is known in the art and embraces those photosensitive materials which after photoexposure are developable by what is known as physical development. Physical development is development using a solution of reducible metal ions and a reducing agent therefor which will selectively deposit metal in the photoactivated areas. In theory, the first step of such development is the formation of latent metal image which is then intensified, or amplified, by the metal obtained by reduction of the aforesaid metal ions. The metal of the latent metal image may be the same as the so-reduced metal or different, e.g., the latent image can be silver and the so-reduced metal, copper, or silver, as desired. In silver halide photography, the latent silver image forms in the silver halide grain in the emulsion on exposure and physical development is used to render the photo-image visible. Conveniently, the reducible metal ion for silver halide film is already present in the photosensitive emulsion in the form of the silver halide. However, an external source of reducible metal ion can be used in lieu thereof. Suitable photosensitive materials include silver halides, such as silver chloride or bromide; azo compounds, e.g., as described in British Specification No. 1,064,726, among others; photoconductors, as described in U.S. Pat. No. 3,380,823; and ferric compounds.

A physically developable image as defined herein is an image which is placed on a grained metallic support such that upon contacting with image-forming materials comprising a solution of metal ions will catalyze the deposition of a conductive metallic image adherently bonded to the support, thus forming a plate capable of being used as a printing plate and preferably as a long run printing plate.

A physically-developable image comprising catalytic nuclei can be formed by photoexposure of a photosensitive layer or by printing or inscribing the support and may include one of the following:

1. the image formed on photoexposure, e.g., the latent silver image in silver halide emulsions or the reversible latent image on a reversibly activatable photoconductor such as titanium dioxide;
2. the irreversible image formed by contacting an exposed photoconductor-bearing medium with a sensitizing metal ion, e.g., a solution of silver ion, which can lead to an invisible irreversible image or a visible metal image;
3. the latent ferrous ion image formed by photoexposure of a ferric salt-sensitized medium and then sensitized with silver ion solution to form a silver image;
4. a conductive image or catalytic nuclei image produced by printing or by writing as taught in commonly owned U.S. Ser. No. 2,440, filed Jan. 12, 1970, now abandoned, e.g., by means of a computer;
5. by physically placing a metallic image adjacent to the support;
6. the germ nuclei image formed by exposure of a prefogged photosensitive material such as lead iodide or $As_2S_3$ such as taught in Malinowski, "Photographic Science and Engineering," Vol. 15, No. 3, May–June 1971, incorporated herein by reference; or
7. the silver photographic image formed by conventional (primarily "chemical") development of an exposed silver halide emulsion.

The thickness of the photosensitive layer or the image-forming layer, and the insulating layer or subbing layer, where present, will depend upon the nature of the photosensitive material, the nature of the binder, where present, the amount of activating radiation utilized, and other like factors. However, in order to obtain an imaging medium capable of rapid processing, it is preferred that the layer of photosensitive material or of catalytic nuclei be relatively thin, preferably less than about 2 microns and more preferably less than about 1 micron in thickness. Most preferably, the layer thickness is from about 0.01 to about 0.5 micron or so thin that it is unlikely that a completely coherent coating exists. However, the thickness of the photosensitive layer and the insulating or subbing layer may vary. For example, in the metal support embodiment the coating may be scraped off except for the portions which are immersed in the roughened surface. The coating thickness may be varied according to the effects desired. However, most preferable is a substrate wherein the coating is less than 1 micron in thickness in order to obtain coherent metal images which are adherently bonded to the support by the rapid processing which is most desired.

The silver halide material preferably used for this invention is dispersed in a binder and contains an excess of halide ions as compared to silver ions. The silver halide may be silver chloride, silver bromide, silver iodide or combinations of these. The crystal size of the silver halide is regulated to obtain the desired photographic speed. A silver halide crystal size of less than about 500 A and more preferably from about 30 to 150 A is especially preferred due to the longer wearing properties of the image, high gamma capabilities, and better adhesion of the metal image to the support. The preferred silver halide layer is one wherein the silver halide grains are dispersed in a binder such as polyvinyl alcohol or gelatin. Polyvinyl vinyl alcohol is an especially preferred binder due to the ability to readily produce a small crystal size silver halide. This emulsion is preferably prepared by a "dump method" whereby a solution of a halide salt, e.g., an alkali metal chloride, is rapidly added to a solution of a soluble silver salt, e.g., silver nitrate, or vice versa. The reason for the improved image qualities when using the small crystal size silver halide is not known for certain. However, it is theorized that it may be due to the improved ability of the smaller particles to get down into the crevices of the grained support, thereby resulting in a better physical interlocking of the image metal with the grain of the support surface and/or to the larger number of catalytic sites for physical development, thereby resulting in a more coherent form of image metal deposit.

It may be desirable to add sensitizing dyes, gamma regulator such as phenylmercuricacetate and physical developer sensitizers such as sulfur compounds as, for example, tetramethylthiuramdisulfide to the silver halide emulsion. The developer sensitizer acts to improve the quality of the metal deposit formed when physically developing an exposed silver halide plate.

It is also understood that a physically developable image can be produced by applying catalytic nuclei to the metallic support. This can be done by inscribing on the metallic support with, for example, a graphite pencil or may be done by applying a germ nuclei layer preferably in a binder and coated with a photo-impermeablizable layer, then exposing to impermeablize the layer in exposed areas. Catalytic nuclei can be any material which will catalyze deposition of metal from the physical developer. Many such materials are known to the art, such as metal sulfide, finely divided metal particles, graphite and the like.

The photoconductor or photocatalyst preferred in this invention are silver halide and reversibly activatable photoconductors which upon exposure to activating radiation remain substantially chemically unchanged.

In a process wherein the photosensitive material is on the metal support which will ultimately form the printing plate, the insulating layer of this support is one which will photoconductively insulate the photoconductor or other photosensitive material. A photoconductive insulator as herein defined is one which will act to substantially prevent the passage to the conducting metallic support of electrons from the activated photosensitive material, e.g., a photoconductor, caused by exposure to activating radiation. This insulating layer is preferably a solvent impermeable layer at least 14 A in thickness. A preferred printing surface for wear characteristics is an aluminum support having a barrier oxide layer of at least about 100 A and preferably between 100 to 200 A in thickness. This is preferably produced by anodization for producing a long run printing plate. It is particularly important that the barrier oxide layer be of sufficient thickness and impermeability to prevent deterioration of the photosensitive layer, e.g., a silver halide emulsion, on prolonged storage of at least about 6 months.

Irradiation sources which are useful in this invention for producing the initial latent image include any of the usual irradiation means commonly used with the selected photosensitive material. Thus actinic light, X-rays, or gamma rays are effective when photoconductors are used. Beams of electrons and other like particles may also be used in the place of the ordinary forms of electromagnetic radiation for forming an image. These various activating means are designated by the term "activating radiation."

Any suitable support which can be physically roughened can be utilized for the copy medium of this invention. Preferably the support is metallic or a substantially metallic backing of sufficient strength and durability to satisfactorily serve as a reproduction carrier can be employed. The support may be in any form such as, for example, sheets, ribbons, rolls, etc. This sheet may be made of plastic, paper or any suitable metal or their alloys, as for example the hydrophilic metals such as chromium, nickel, lead, stainless steel, magnesium, or aluminum; or the oleophilic metals such as copper or zinc. Aluminum is preferred because of its desirable physical and chemical properties, as well as its economy. Aluminum as used herein is intended to include alloys of aluminum such as aluminum containing minor amounts of manganese, copper or magnesium. A porous anodized surface is especially preferred for the aluminum support. The anodized surface may be sealed by heating. However, the unsealed surface is preferred because of the improved adhesion that can be obtained between the metal image and the aluminum support. For long run printing plates an alloy such as Type 1100 aluminum is used which will resist cracking and will have the strength for these long runs.

The support may be of any suitable thickness. However, a thickness from about 0.006 to 0.025 inches is preferred for use as printing plates, and preferably for long run printing plates, the thickness is from about 0.012 to 0.015 inches.

The physically roughened support is a support which has been physically, chemically, or otherwise roughened in order that the metallic images are adherently and intimately bonded to the support. Preferred supports which are suitable for this invention are ones having grained, porous, or matted surfaces. Chemically roughened supports are ones which have been treated by suitable acids or bases, and the like to cause the formation of a grain or tooth similar to that formed in physical roughening processes such as brush graining. Preferred surfaces are those which have been brush grained, chemically grained, electrochemically grained, or grained by blasting with abrasive particles (sand blasting).

The support and imaging metal may be chosen so as to give a good oleophilic-hydrophilic differentiation for use in a lithographic process. Also, by special treatments or the right substrate or imaging metal this process can be used to produce a plate useful in the so-called driographic manner described in U.S. Pat. No. 3,511,178, incorporated herein by reference.

The physical developers useful in this invention are those image forming systems such as described in U.S. Pat. No. 3,152,903; in U.S. Pat. No. 3,380,823, and in U.S. Pat. No. 3,390,988, incorporated herein by reference. These image-forming materials include preferably an oxidizing agent and a reducing agent. Such image-forming materials are also often referred to in the art as electroless plating baths. Electrolytic development such as taught in U.S. Pat. No. 3,152,969 can also be used. The oxidizing agent is generally the image-forming component of the image-forming material. Either organic or inorganic oxidizing agents may be employed as the oxidizing component of the image-forming material. The oxidizing and reducing agent may be combined in a single processing bath, may also be in separate bath, or one or both of these components may be incorporated in the imaging medium prior to exposure. Preferred oxidizing agents comprise the reducible metal ions having at least the oxidizing power of cupric ion and include such metal ions as $Ag^+$, $Hg^{+2}$, $Pb^{+4}$, $Au^{+1}$, $Au^{+3}$, $Pt^{+2}$, $Pt^{+4}$, $Ni^{+2}$, $Sn^{+2}$, $Pb^{+2}$, $Cu^{+1}$, and $Cu^{+2}$.

The reducing agent component of the said image-forming materials are inorganic compounds such as the oxalates, formates, and ethylenediaminetetraacetate complexes of metals having variable valence; and organic compounds such as dihydroxybenzenes, aminophenols, and aminoanilines. Also, polyvinylpyrrolidone, hydrazine, and ascorbic acid may be used as reducing agents in this invention. Suitable specific reducing compounds include hydroquinone or derivatives thereof, o- and p-aminophenol, p-methylaminophenol sulfate, p-hydroxyphenyl glycine, o- and p-phenylenediamine, 1-phenyl-3-pyrazolidone, alkali and alkaline earth metal oxalates and formates.

A preferred physical developer useful in this invention is a stabilized physical developer comprising a solution of metal ions, a reducing agent and an ionic surfactant as a developer stabilizer and especially preferred stabilized developer comprises a soluble silver compound, a ferric compound, a ferrous compound and an ionic surfactant such as taught in the aforementioned U.S. Pat. No. 3,390,988 and in British Patent Specification No. 1,063,694, also incorporated herein by reference. This physical developer preferably comprises an aqueous solution of ferrous ion, ferric ions, silver ions, a complexing agent for complexing the ferric ions such as an organic acid, and an ionic surfactant as a stabilizing agent and wherein the $\Delta E$ of the developer is such that a printing plate as described in this invention can be produced, preferably in a time period of less than about 5 minutes. A preferred physical developer also comprises a non-ionic surfactant as a stabilizer of cationic surfactants in the developer. A preferred developer is an acid-reacting physical developer comprising a soluble silver compound and containing also a ferrous compound, a ferric compound, and an ionic surface-active compound as a development stabilizer, the concentration of the silver compound being greater than 0.006 mols/liter, and that of the ferrous-compound greater than 0.05 mols/liter, the ferric compound being present in a concentration such that the rate of development and/or the period of life of the developer is or are greater than that or those of a reference developer of the composition:
 0.050 mols/liter of ferrous sulphate
 0.005 mols/liter of ferric nitrate
 0.14 mols/liter of citric acid
 0.006 mols/liter of silver nitrate
and which contains the same stabilizer in the same amount, the rate of development as well as the period of life each being at least equal to that of this reference developer.

Liquid physical developer systems are preferred for use as image-forming materials because of the excellent results obtained therewith. Any suitable solvent may be utilized. However, aqueous processing baths are preferred. While the pH of the developer is not critical, it has been found that with metal base media the best results are obtained with an acid developer, and especially one having a pH of between about 2 and 5, and especially with organic acids such as citric, gluconic, maleic, and oxalic which are metal complexing agents. A pH of about 2 to 3 is especially preferred. It is believed that the acid functions by dissolving the oxide layer on a metal such as aluminum, therefore improving the adhesion and conductivity of the image to the metallic support.

Additionally, the image-forming materials or physical developers may contain organic acids or alkali metal salts thereof, which can react with metal ions to form complex metal anions. Further, the developers may contain other complexing agents and the like to improve image formation and other properties found to be desirable in this art.

The physical developers of this invention should be applied for a length of time sufficient to obtain an image adherently and, in metal base media preferably conductively, bound to the grained metallic support in order to produce an imaged plate suitable for use as a printing plate. This time period will vary according to the thickness of the other layer or thickness of the insulating layer or otther separation layers, the length of exposure, nature of the binder or insulator material, ratio of photosensitive material to binder, and like factors known to the art.

A useful plating bath for amplifying a metallic image which is conductively bonded to a metal support is the one comprising a metal ion and a pickling agent for the metal of the metallic support, e.g. a solution of copper ethylenediaminetetraacetic acid (CuEDTA) and sodium EDTA.

The metal image of this invention is a lustrous, coherent metal as opposed to the particulate black or dark metal of most photographic images. Furthermore, these images are adherently bonded to the support. The type of image metal plus the bonding to the support gives the plate the capability of being used as a printing plate. Silver images have been found preferable in producing long run printing plates due to their oleophilic properties and long wear properties.

A preferred process according to this invention for making inked printing plates and using these plates for printing which comprises: contacting an imaging medium comprising a continuous tone latent image in a thin silver halide layer with a physical developer for a period of time sufficient to produce a coherent metal image adherently bonded to the medium, contacting the surface of the imaged medium with a printing ink which selectively adheres to the image areas, and contacting the inked medium with a receptor sheet for said ink. Preferably a lithographic printing process is used by treating the surface of the imaged medium with an aqueous fountain solution, and with a printing ink having an oleophilic binding agent, whereby said ink adheres to the areas of the surface corresponding to the physically developable image, and using said inked imaging medium to print by lithography. Alternatively, a low tack ink may be used on a lithographic press without the fountain solution to print by driography. In driographic printing the non-image areas of the plate are made to reject oleo ink by, for example, coating these areas with a polysiloxane elastomeric polymer.

The invention above described is exemplified as follows:

EXAMPLE 1

A brush grained aluminum sheet material of about 0.009 inch in thickness is coated with finely divided $TiO_2$ dispersed in a slightly hydrolyzed polyvinyl alcohol binder. An aqueous $TiO_2$-polyvinyl alcohol coating formulation is applied with a 4 Mayer rod to a thickness of about $4.0 \times 10^{-5}$ inches.

After drying, the printing plate thus produced is exposed to a continuous tone and a halftone image pattern from a light source (quartz iodide lamp) for 5 seconds duration, thereby giving an exposure of 80,000 meter candle seconds, producing a latent image on the plate medium.

The thus exposed plate is then immersed in an aqueous solution of 3N silver nitrate for 10 seconds, allowed to drain, then immersed in an aqueous developing solution having a pH of about 2.5 comprising the following:

| Metol | 20.0 grams |
|---|---|
| Citric Acid | 12.5 grams |
| Water to 1 liter | | and then immersed in a sodium thiosulfate fixing bath. The coating is washed from the surface of the plate, a visible image of good density is produced on the thus treated medium. The silver image is deposited in the surface of the aluminum sheet. Attempts to erase the visible image by means of vigorous abrasion from a pencil eraser or by application of Scotch Brand Transparent Tape on the image areas and then ripping the tape off vigorously without removing the images from the plate indicates that the image is truly imbedded in the surface of the grained aluminum sheet. An ohmmeter is used to test the conductance of the image and non-image areas. Much greater conductance is shown in the image areas as compared with the non-image areas, thus showing that the image is conductively bound to the aluminum support.

The plate is then treated with the following electroless copperizing solution:

| Solution 1 | |
|---|---|
| $CuSO_4 \cdot 5H_2O$ | 40 grams |
| $H_2O$ | 240 grams |
| 28% $NH_4OH$ | 63 mls. |

| Solution 2 | |
|---|---|
| Sodium Sulfoxylate Formaldehyde ($CH_2OHSONa \cdot 2H_2O$) | 20 grams |
| $H_2O$ | 50 grams |

Just prior to use, Solutions 1 and 2 are mixed. The plate is immersed for 3–5 minutes. The results of this treatment is the copper plating of the imbedded silver image areas only. The thus copper imaged plate is then treated with a dilute solution of phosphoric acid ($H_3PO_4$), and inked with rub-up ink. The plate is now used for printing on an offset press to run off one hundred thousand (100,000) copies. Good continuous tone and halftone prints are produced. The print has a resolution of 200 lines per mm.

As an alternate procedure to contacting with the electroless copperizing solution, the silver imaged aluminum plate is contacted with a copper electroplating bath which plates out copper selectively in the silver image areas of the plate. This thus imaged plate is then used on a lithographic press for producing multiple copies.

Similar results are obtained when the above example is repeated except that a silver chloride-polyvinyl alcohol emulsion containing a sulfur sensitizer is substituted for the $TiO_2$-polyvinyl alcohol coating. This silver halide emulsion has a calculated dry thickness of less than about 0.5 micron.

EXAMPLE 2

A brush grained aluminum foil or sheet is coated, exposed and developed as explained in Example 1 to produce an aluminum plate with a silver image adherently bound to the grained aluminum foil. However, the plate is not treated with a copperizing solution. The deposited silver image is instead treated with the following dispersion:

| 2-mercaptobenzothiazole | 1.0 grams |
|---|---|
| 85% $H_3PO_4$ | 1.0 grams |
| Water | 80.0 grams |

The dispersion is wiped on the plate with a cotton swab. The plate is now used on an offset press. The silver image itself will now accept the greasy printing ink and the non-exposed background areas accept water.

EXAMPLE 3

A brush grained aluminum support is prepared as follows: Type 1100 aluminum having a thickness of 0.012 inch is brush grained using a standard Fuller graining unit. The Fuller unit consists of two 12 inch diameter cores upon which are mounted nylon brushes in helical form. These brushes are oscillated at approximately one cycle per 3 seconds. The aluminum in coil form is traveling at a speed of approximately 7 feet per minute. The abrasive pumice mixture contained 350 mesh silica. These conditions produce a grain which when tested on the OSRM produces a trace having a peak Height A of 0.76 at a Position B of 0.80 and having a psi Value C of 0.96 and assymeter value of 0.06, wherein the OSRM measurements are conducted in copending application U.S. Ser. No. 174,102, filed Aug. 23, 1971, now U.S. Pat. No. 3,782,827 incorporated herein by reference. This grained aluminum support is then roller-coated with an emulsion of silver chloride having an excess of chloride ions and a sulfur compound as a physical development sensitizer in a polyvinyl alcohol binder. The weight ratio of silver chloride to binder is 1 to 1. The total solids of the emulsion solution was 3.5% by weight. The calculated dry thickness of the photosensitive layer on the plate is less than 0.1 micron. The coated plates are then air dried and exposed to a continuous tone test negative and also a test negative containing a standard 21 step exposure wedge for six seconds to a carbon arc light source. The exposure was performed by contact printing of the negative to the photosensitive plate. The exposed plate is then contacted for 3 minutes with a physical developer of the following composition:

Solution 1
78.4 g Ferrous Ammonium Sulfate 32.3 g Ferric Nitrate
80.0 g Citric Acid
Distilled H₂O to 1 liter
Solution 2
   0.75 g Synthrapol N (non-ionic surfactant)
   1.60 g Alamine 4 (ionic surfactant)
   0.8 g Alamine 11 (ionic surfactant)
   2.4 g Acetic Acid
   Distilled H₂O to 1 liter
Solution 3
   3N AgNO₃

125 ml of Solution 1 is added to 25 ml of Solution 2 and 6 ml of Solution 3. A silver image having the appearance of continuous tone is deposited having a low gamma and extended tonal range.

The imaged plate is then washed and treated with a printing plate lacquer which comprises gum arabic, phosphoric acid, mercaptobenzothiazole, dimethylformamide and an oleophilic resin which will selectively adheret to the silver image as opposed to the background areas of the plate. The plate is then placed on an offset lithographic printing press and used to print 1,000 copies which are random dot, continuous tone likenesses of the continuous tone test negative.

We claim:

1. Process of recording a continuous tone image comprising:
   a. forming a continuous tone physically developable image on a physically roughened support and
   b. physically developing by contacting said medium with image forming materials comprising a source of metal ions external to the photosensitive layer and wherein the thickness of the physically developable image, the roughness of the support, the proximity of the physically developable image with respect to the surface of the support, and the length of contacting of said medium with said image forming materials being such as to selectively deposit sufficient metal to thereby form a coherent metal image of low contrast and having an extended tonal range and which is adherently bonded and in intimate contact with said support.

2. Process as in claim 1 wherein the physically developable image is produced in the exposed portions of a photosensitive layer and wherein the photosensitive layer comprises silver halide, titanium dioxide, or zinc oxide.

3. Process as in claim 2 wherein the physically developable image is produced in the exposed portions of a photosensitive layer and wherein the photosensitive material of the photosensitive layer comprises silver halide having a thickness of less than about 2 microns and wherein the metal ions are silver ions.

4. Process of continuous tone printing comprising:
   a. exposing to a continuous tone image pattern a copy medium comprising a thin photosensitive layer on a physically roughened support to form a physically developable image in said layer;
   b. physically developing by contacting said medium with image forming materials comprising a source of metal ions and wherein the thickness of the physically developable image, the roughness of the support, the proximity of the physically developable image with respect to the surface of the support, and the length of contacting of said medium with said image forming materials being such as to thereby form a coherent metal image of low contrast and having an extended tonal range and in said photosensitive layer which is adherently bonded and in intimate contact with said support;
   c. contacting the surface of the metal imaged medium with printing ink which selectively adheres in an image pattern to the imaged medium; and
   d. transferring the image pattern of ink onto a receptor sheet for said ink to produce prints of the original image.

5. Process of continuous tone printing comprising:
   a. forming a physically developable image in a photosensitive layer of a copy medium comprising said photosensitive layer on a physically roughened support, the thickness of the photosensitive layer being less than about 2 microns;
   b. physically developing by contacting said medium with image forming materials comprising a source of metal ions for a period of time sufficient to produce a coherent, low contrast metal image having an extended tonal range and which is adherently bonded to the medium and capable of being used on a conventional offset lithographic press under ordinary operating conditions to produce inked paper prints;
   c. contacting the surface of the metal imaged medium with printing ink which selectively adheres in an image pattern to the imaged medium; and
   d. transferring the image pattern of ink onto a receptor sheet for said ink to produce prints of the original image.

6. Copy medium comprising a physically roughened support having adherently and intimately bonded thereto a low contrast metal image having an extended tonal range comprising the metal and a photoconductor layer having a thickness of less than about 2 microns, and wherein the metal is present in an amount of at least about 1 gram of metal per square meter in the image areas.

7. Copy medium as in claim 6 wherein the photoconductor layer comprises silver halide, titanium dioxide, or zinc oxide.

8. Printing plate comprising a physically roughened metallic support having adherently and intimately bonded thereto a low contrast metallic image having an extended tonal range and comprising the metal and a photoconductor layer having a thickness of less than about 2 microns, and wherein the metal is present in an amount of at least about 2 grams of metel per square meter in the image areas.

9. A lithographic printing plate comprising a physically grained aluminum support and a low contrast silver metal image having an extended tonal range and adherently and conductively bonded to the grain of the support and wherein the silver metal is present in an amount of at least about 0.2 grams per square meter in the image areas.

10. Plate as in claim 9 wherein the aluminum support is anodized and wherein the silver images present in the image areas in an amount of between about 1 and about 10 grams per square meter.

* * * * *